United States Patent [19]
Tasdighi et al.

[11] Patent Number: 5,283,579
[45] Date of Patent: Feb. 1, 1994

[54] DIGITAL TO ANALOG CONVERTER HAVING HIGH MULTIPLYING BANDWIDTH

[75] Inventors: Ali Tasdighi, San Jose; Roger A. Levinson, San Francisco; Quoi V. Huynh, San Jose; John M. Caruso, Fremont, all of Calif.

[73] Assignee: Micro Power Systems, Inc., Santa Clara, Calif.

[21] Appl. No.: 847,458

[22] Filed: Mar. 6, 1992

[51] Int. Cl.$^5$ .............................................. H03M 1/66
[52] U.S. Cl. ...................................... 341/145; 341/133; 341/135; 341/136
[58] Field of Search ................ 341/133, 134, 135, 136, 341/144, 145

[56] References Cited

U.S. PATENT DOCUMENTS

| | | | |
|---|---|---|---|
| 3,365,712 | 1/1968 | Chang et al. | 341/133 X |
| 3,400,257 | 9/1968 | Smith | 341/144 X |
| 3,997,892 | 12/1976 | Susset | 340/347 DA |
| 4,338,591 | 7/1982 | Tuthill | 340/347 DA |
| 4,491,825 | 1/1985 | Tuthill | 340/347 DA |
| 4,543,560 | 9/1985 | Holloway | 341/144 X |
| 4,638,303 | 1/1987 | Masuda et al. | 341/136 |
| 4,918,448 | 4/1990 | Hauviller et al. | 341/145 |
| 5,111,205 | 5/1992 | Morlon | 341/145 X |
| 5,212,482 | 5/1993 | Okuyama | 341/145 X |

OTHER PUBLICATIONS

Millman, Microelectronics Digital and Analog Circuits and Systems, copyright 1979 McGraw-Hill, Inc., pp. 382, 402 and 543–544.
Grzybowski, Waclaw et al. "nonlinear functions from d.-a. converters," *Electronic Engineering* Jul. 1971, pp. 48–51.

*Primary Examiner*—Howard L. Williams
*Attorney, Agent, or Firm*—Townsend and Townsend Khourie and Crew

[57] ABSTRACT

A digital to analog converter (DAC) incorporates a novel subranging voltage output DAC that delivers high multiplying bandwidth while consuming low power and requires small silicon area. The higher order digital input bits (MSBS) select a voltage range (VMSB) from a first resistor divider DAC network. The VMSB is then applied to the input of a small high speed low power differential input single ended output LSB programmable attenuator amplifier. Transistor follower devices effectively buffer the MSB section to the LSB section and increase bandwidth and speed of operation as well as permitting multichannel sharing of a single precision MSB voltage divider network.

18 Claims, 7 Drawing Sheets

DIGITAL TO ANALOG CONVERTER HAVING HIGH MULTIPLYING BANDWIDTH

BACKGROUND OF THE INVENTION

This invention relates generally to digital to analog converters (DACs), and more particularly the invention relates to a DAC having a sub-ranging voltage output with increased multiplying bandwidth and reduced power.

There is a growing demand for small multichannel, medium resolution high bandwidth low power DACS. Many applications such as robotic, automatic test equipment, monitors, work stations, copiers, cameras, portable equipment, scanners., video, graphic systems and others require high-multiplying bandwidth multiple channel DACs implemented efficiently and cost effectively. Such applications require elements for controlling, adjusting and tuning fast signals using digitally controlled gain or attenuation.

Segment converters can be arranged in cascaded formats, such that a first stage employing a resistor string decodes the most significant bits and a second stage decodes the remaining lower order bits. A nonlinear converter of the general type is described by Gryzbowski et al. "Nonlinear Functions from D/A converters," *Electronic Engineering*, 1971, pp 48-51. This converter is designed for operation with relay switching. U.S. Pat. No. 3,997,892 (Susset) discloses a cascaded nonlinear converter design intended for use with low speed semiconductor switching where a DC signal is applied across the positive and negative terminals of the reference input. In this design both the first and second stages comprise a resistor string segment type converter. The converter design includes buffer amplifiers to prevent the second stage resistor string (LSB DAC) from loading the first stage resistor string. The architecture is slow, takes much area, and places many different types of devices in series with the signal path which makes it impractical for multichannel and high multiplying bandwidth applications.

U.S. Pat. Nos. 4,338,591 and No. 4,491,852 (Tuthill) disclose a two-stage cascaded converter intended for high resolution, low speed applications wherein the first stage comprises a series connected resistor string segment converter. The voltage across the selected resistor of the string is, in turn, coupled through a pair of buffer amplifiers to the input terminals of a conventional second stage inverted R-2R LSB DAC. The DAC uses buffer amplifiers for precision reasons. The architecture is slow, takes much area, places many different types of devices in series with the signal path which makes it impractical for multichannel and high multiplying bandwidth applications.

Another type of DAC disclosed in the prior art for multiple channels of DC (constant reference) type DACS, uses a single DAC whose output feeds multiple sample and hold amplifiers. This implementation gives excellent matching between channels but requires a systematic updating and refreshing of each channel which causes glitches in the DAC outputs and creates a noisy analog environment for the system designer.

Although the prior art converters noted above embody certain attractive aspects, they are not capable of the high speed, low distortion, low power, low noise, small size, and multiple channels now required in many applications.

SUMMARY OF THE INVENTION

In accordance with the present invention, a DAC includes a first voltage divider network controlled by most significant bits (MSB) of a digital code, at least a second voltage divider controlled by least significant bits (LSB) of the digital code, and transistor followers connecting voltages from the first voltage divider to the second voltage divider. A single output from the second voltage divider is connected to output circuitry of the DAC.

The transistor followers can be bipolar emitter followers or field effect source followers (e.g. JFET, MOSFET) with one of the transistor followers being connected to provide current to a current mirror. The output circuitry includes a similar transistor follower which receives the output from the second voltage divider. A closed loop buffer amplifier can be provided with the input connected to the current mirror to receive controlled current. The output of the transistor follower is connected to the input and forms part of a feedback circuit connecting the buffer amplifier output to the input. The feedback circuitry can include a gain adjust voltage divider.

In accordance a feature of the invention, a plurality of second voltage dividers can share the first voltage divider network in a multichannel embodiment. The first voltage divider controlled by the MSB of digital codes can be a precision network while the plurality of second voltage dividers controlled by the LSB have smaller accuracy requirements therefore allowing smaller structures with less capacitance, higher speeds and smaller silicon area for the LSB DAC networks.

The invention and objects and features thereof will be more readily apparent from the following detailed description and appended claims when taken with the drawings.

DETAILED DESCRIPTION OF THE ILLUSTRATIVE EMBODIMENTS

Figure 1:
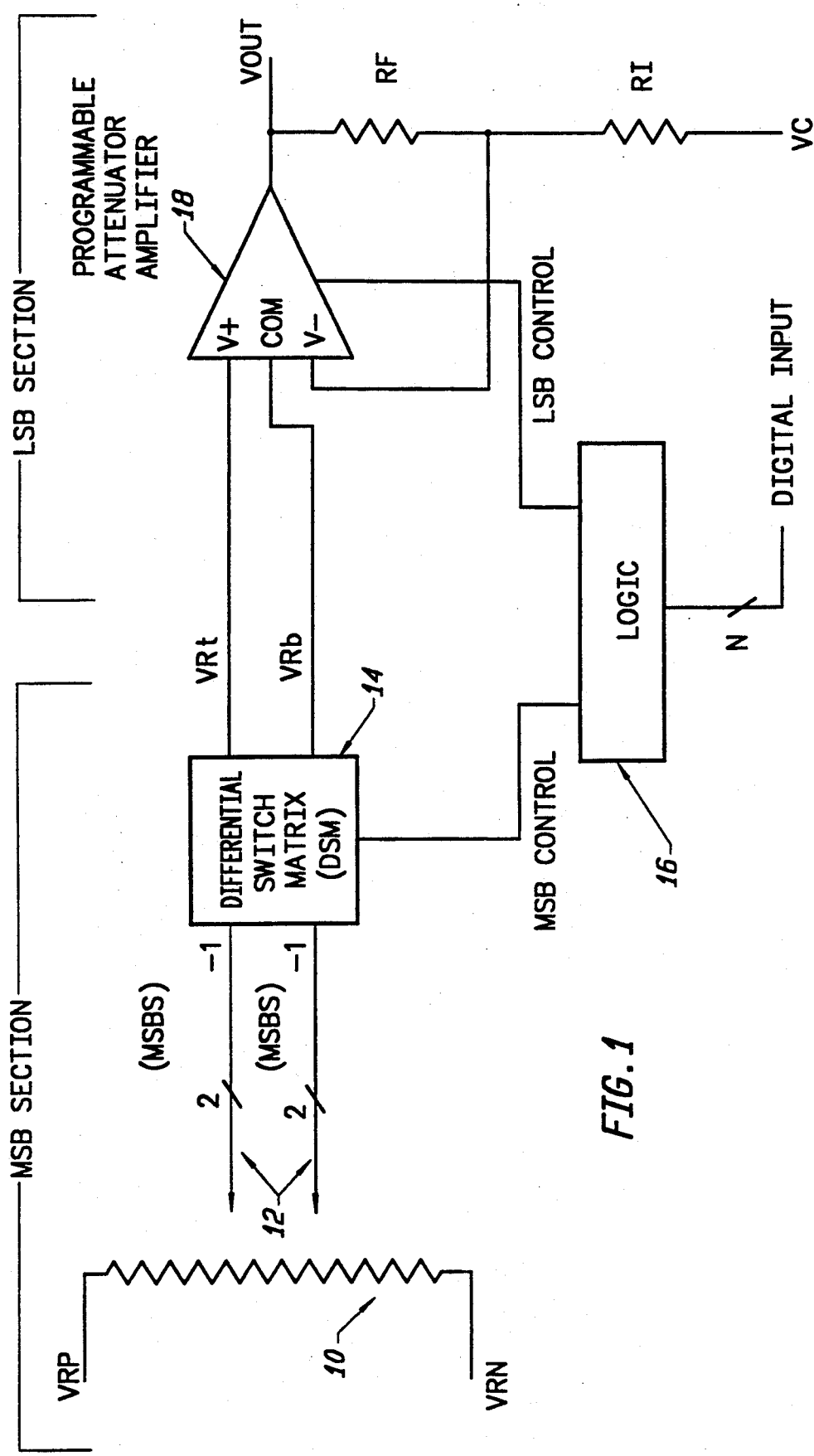
FIG. 1 is a schematic diagram illustrating a digital to analog converter in accordance with a preferred embodiment of the invention.

FIG. 1 is a schematic diagram of a digital to analog converter (DAC) in accordance with a preferred embodiment of the invention. The most significant bit (MSB) section includes a first voltage divider 10 including a first plurality of resistors connected between a first reference voltage (Vrp) and a second reference voltage (Vrn). The first voltage divider is preferably a conventional thermometer type string of serially connected resistors with taps 12 variably connected across a resistor in response to a differential switch matrix (DSM) 14 controlled by the most significant bits (MSB) of a digital input. The digital input (N bits) is applied through logic 16 with the MSB bits applied as control for the differential switch matrix 14 and the LSB bits controlling a programmable attenuator amplifier shown at 18 in the LSB section.

Taps 12 provide two reference voltages, Vrt and Vrb, as the top and bottom reference voltages applied to the programmable attenuator amplifier 18. The output of the attenuator amplifier 18 is applied through a voltage divider network comprising resistors Rf and Ri back to the negative input of the amplifier 18.

Voltage divider 10 comprises a precision resistor ladder. The relationship between Vrt and Vrp is set by the resistor ladder and the decoding logic. For a binary converter $$Vrt - Vrb = (Vrp - Vrn)/(2^{msb})$$

where $2^{msb}$ is 2 raised to the power of the number of the msb bits.

Vrt and Vrb feed into the positive and common terminals of the programmable attenuator 18 and the gain of the programmable attenuator amplifier is controlled by the LSBs and has the following transfer function $$Vout = Vcom + GAIN(1sb)(V+ - Vcom)$$

where GAIN(lsbs) represents the gain as a function of the LSB code. For a binary converter, $$Vout = Vcom + [D/(2^{lsb})](V+ - VCOM)$$

where D is the LSB code and 2 is 2 raised to the power of the number of the lsb bits. The output of the amplifier is fed back to the negative input terminal to give a closed loop buffer amplifier with the Rf/Ri ratio setting gains for different voltage output swings.

Figure 2:
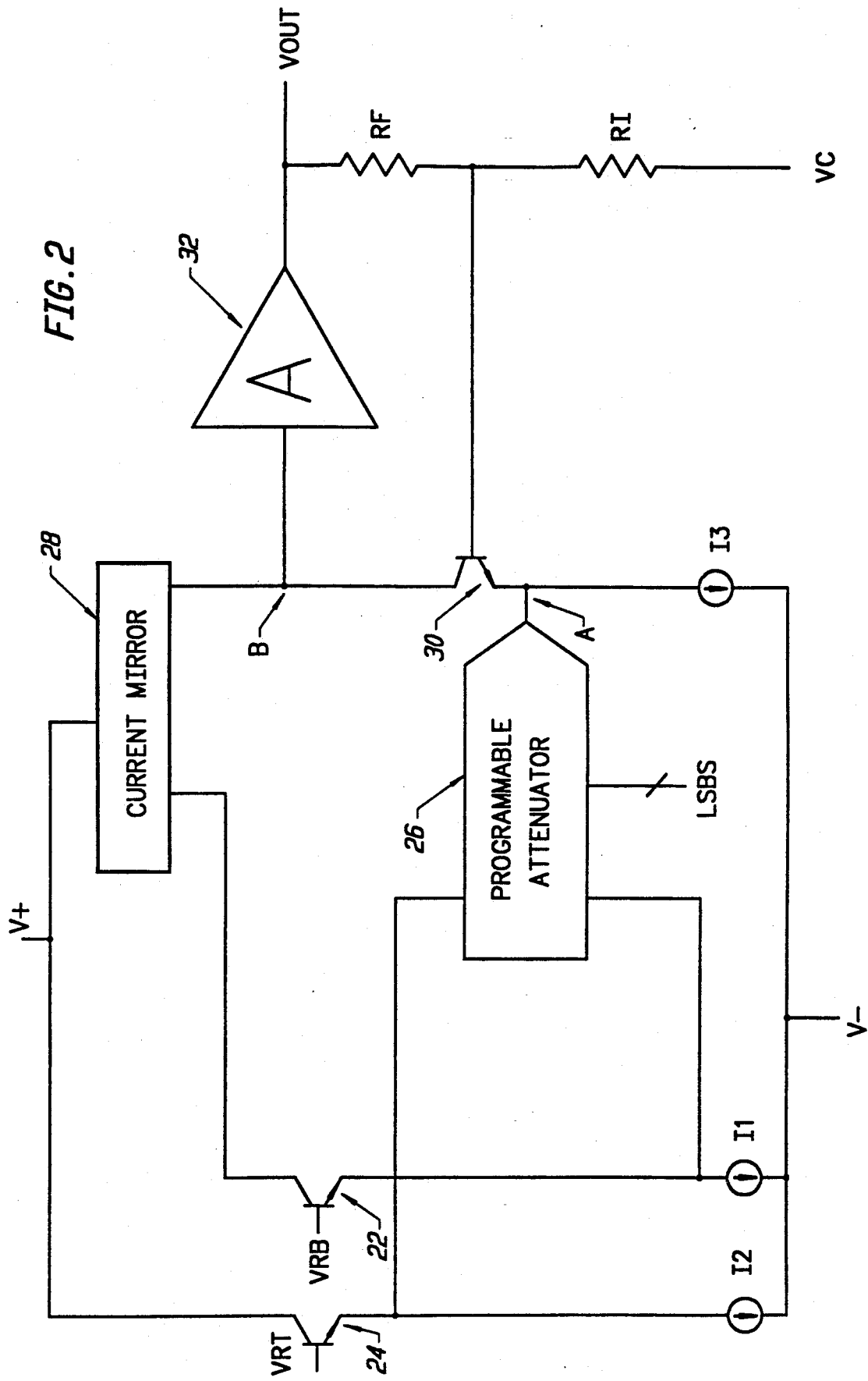
FIG. 2 is a schematic diagram illustrating in more detail the digitally programmable attenuator amplifier with dynamic current boosting closed loop buffer in the DAC of FIG. 1.

FIG. 2 is a more detailed schematic of the digitally programmable attenuator amplifier with dynamic current boosting closed loop buffer. Vrb is applied to the base of a first transistor follower 22 and Vrt is applied to the base of a second transistor follower 24. In this embodiment the transistor followers are bipolar emitter followers,, but other transistor followers such as FET source followers can be employed. The transistor followers 22, 24 provide a differential IN, differential OUT buffer between the MSB and the LSB sections and since the two transistors are matched, the difference voltage directed to the next stage is only DC shifted. As one of the differential followers carries the common mode signal of the MSB weight, the second transistor follower is in a closed loop differential to single ended programmable attenuator amplifier loop that adds the LSB weight to the common mode signal of the MSB weight by means of the programmable attenuator 26. The programmable attenuator can include any one of a number of conventional voltage divider circuits such as an R-2R DAC, a current mode DAC, a thermometer type DAC or the embodiment described further hereinbelow with reference to FIG. 6. Transistor 24 also acts as an AC current booster (neutralization) by means of a current mirror 28 for the LSB attenuator amplifier and becomes part of a small and fast output buffer for the entire DAC. The programmable attenuator 26 is controlled by the LSB bits, and the output is applied to the emitter of transistor 30 (node A). Transistor 30 is the same type of device as transistors 22, 24 and therefore compensates for the DC level shift through the differential followers while forming the buffer amplifier with transistors 22 and 24.

Current source I1 is serially connected with transistor 22 and current mirror 28 between V+ and V−, current source I2 is serially connected with transistor 24 between two voltage levels V+ and V−, and current source I3 is serially connected with transistor 30 between V− and the controlled current from current mirror 28 (node B).

The output of the DAC is provided by a buffer amplifier 32 having an input connected to the controlled current from current mirror 28 (node B) and to a feedback loop including voltage divider resistors Rf, Ri and transistor 30.

The differential transistor followers have the advantage of very high bandwidth and very high speed which passes the AC VMSB portion of the signal with full bandwidth and very little distortion. The transistor follower buffers also allow the use of minimum size switches in the differential switch matrix with minimum load on the MSB structure and thus minor influence on the multiplying bandwidth of the DAC. The accuracy requirements of the LSB section are divided by $2^{msb}$ which translates into small structures with less capacitance, higher speeds, and small silicon area for the LSB DAC network.

Figure 3A:
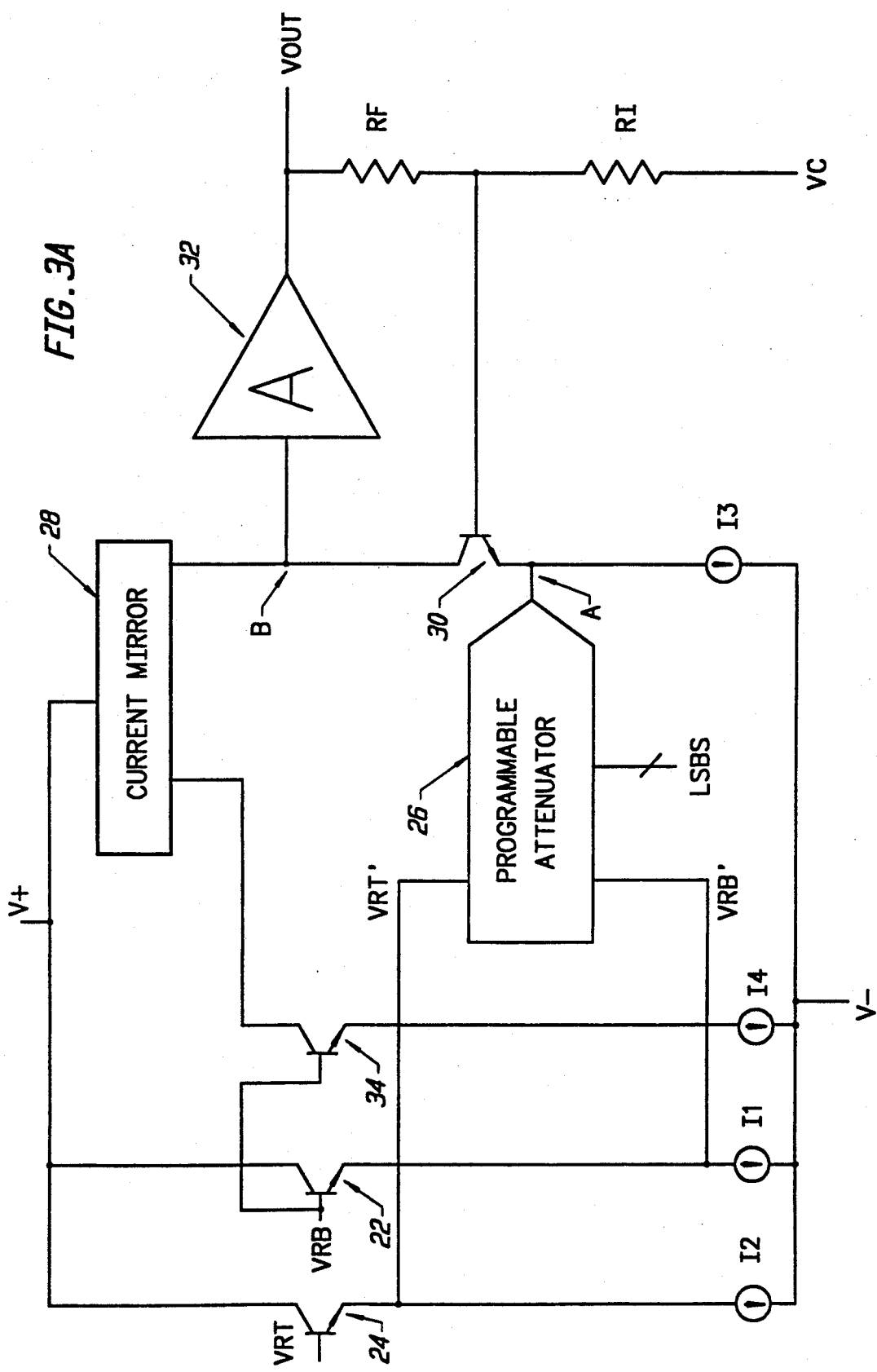
FIG. 3A and FIG. 3B are schematic diagrams illustrating other embodiment X of digital to analog converters in accordance with the invention.

FIG. 3A is an alternative embodiment of the digitally programmable LSB attenuator amplifier. The same elements in FIGS. 2 and 3A have the same reference numerals. In this embodiment a third transistor follower 34 (bipolar emitter follower) is controlled by Vrb and is serially connected with current source I4 to the current mirror 28. Emitter follower 22 is serially connected with current source I1 between V+ and V− with the emitter providing Vrb' to the programmable attenuator 26.

Figure 3B:
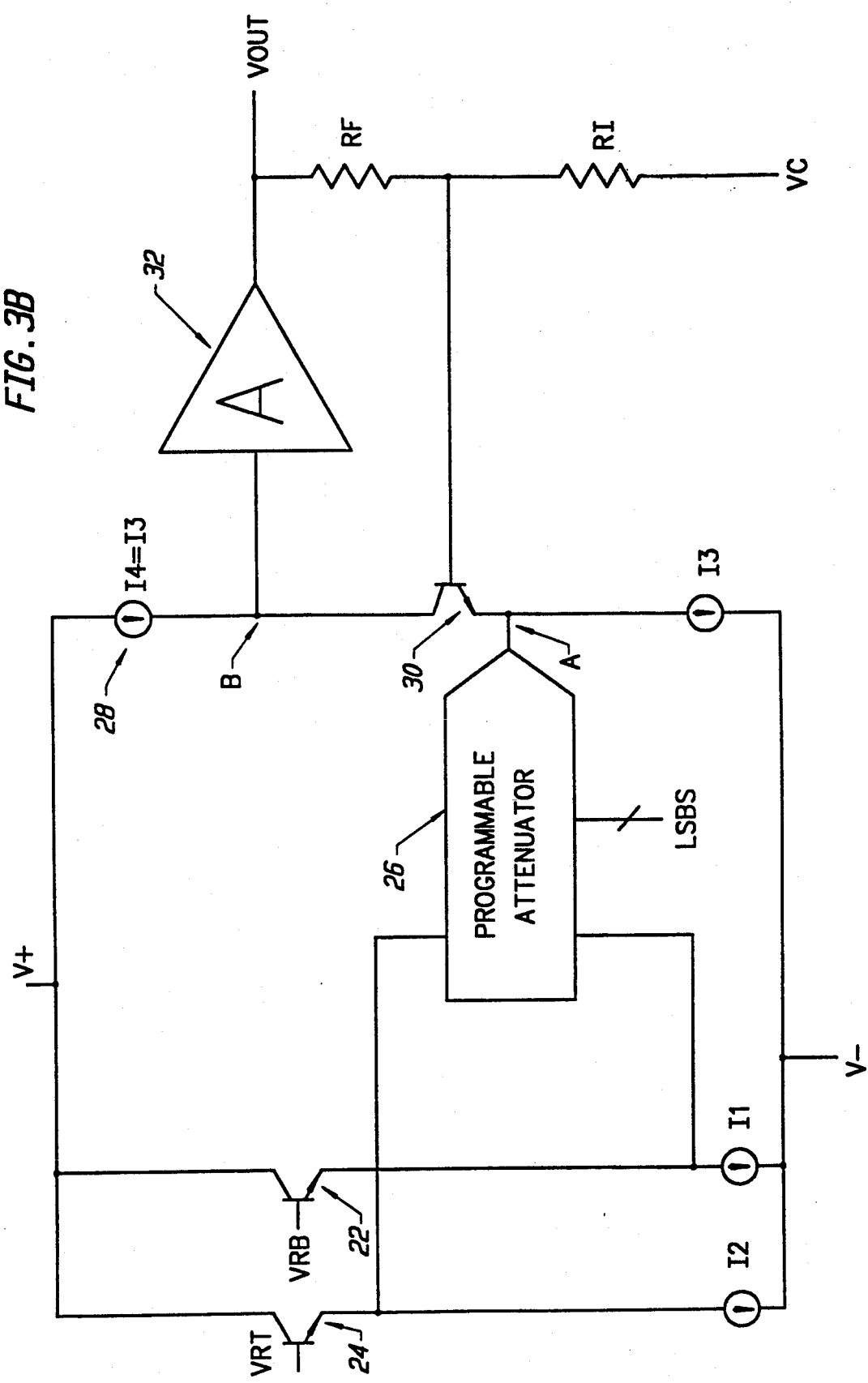

FIG. 3B is a schematic of another embodiment of the DAC, and again the same elements in FIGS. 2 and 3B have the same reference numerals. In FIG. 3B the current mirror is eliminated,, and the collector of transistor 22 is connected directly to V+ while the collector of transistor 30 and the input of buffer 32 (node B) are connected through current source I4 to V+.

Figure 4:
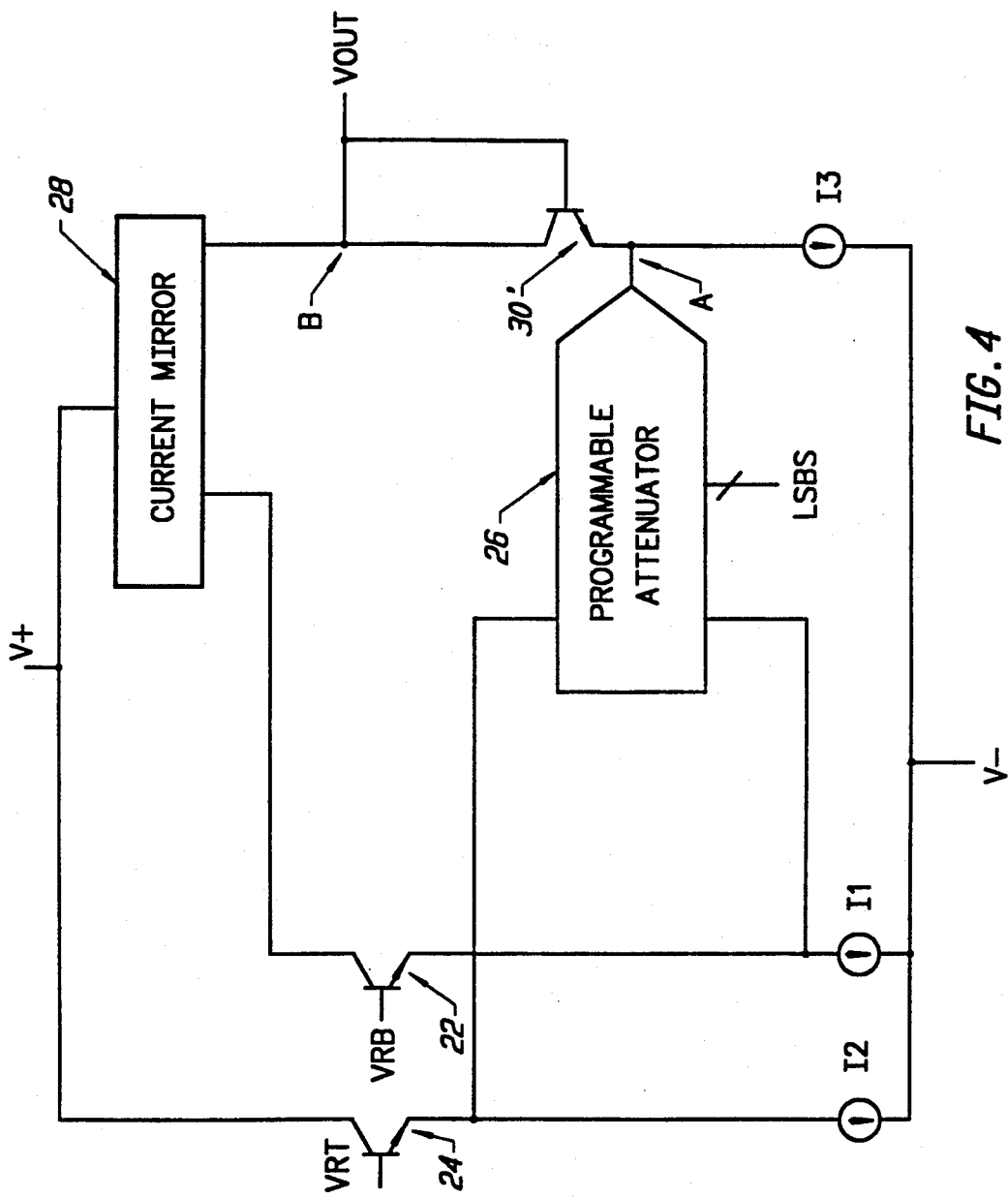
FIG. 4 illustrates an alternative implementation of the output stage in the DAC of FIGS. 1-3.

The buffer amplifier 32 in the output of the DAC of FIG. 2 and FIGS. 3A and 3B can be replaced by a diode connected transistor as illustrated by bipolar transistor 30' in FIG. 4. The base-collector terminals of transistor 30' are connected to the controlled current of current mirror (CM) and provide the output of the DAC.

Figure 6:
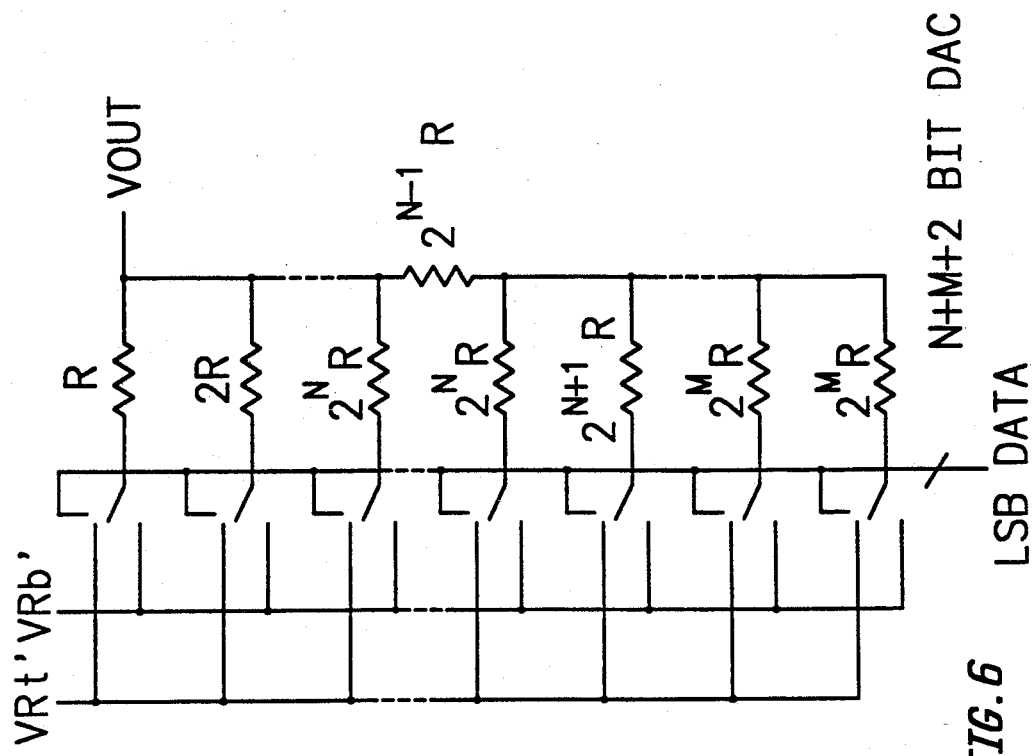
FIG. 6 is a schematic of an LSB DAC useful in the implementation of FIGS. 1-3.
Figure 5:
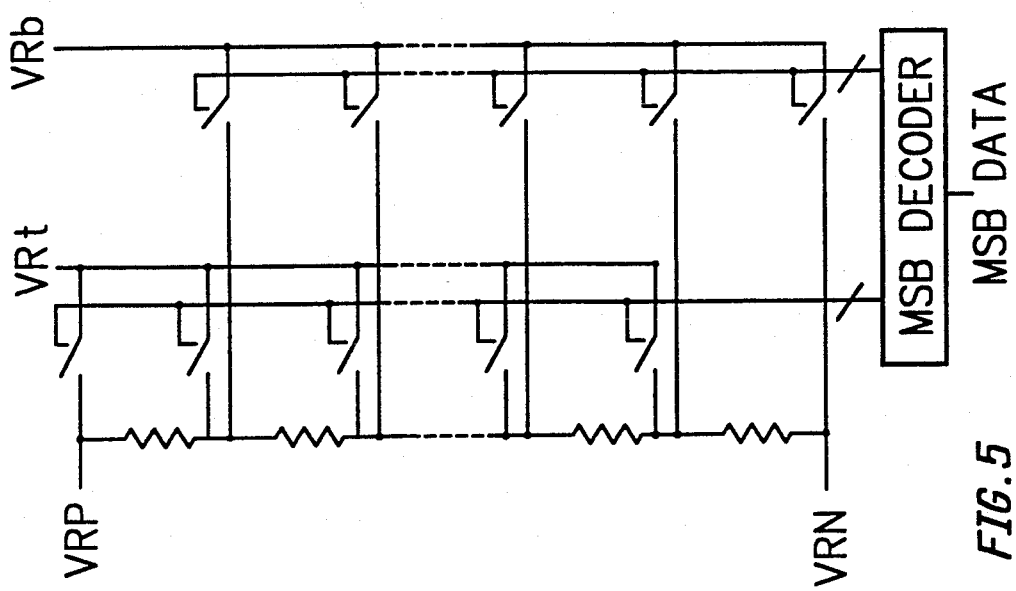
FIG. 5 is a schematic of an MSB DAC useful in the circuitry of FIG. 1.

FIG. 5 is a schematic of a conventional thermometer serially connected resistor divider network which can be used as the MSB voltage divider 10 in FIG. 1. As noted above, the programmable attenuator 26 can include any one of several conventional resistor ladder networks, but the resistor ladder network of FIG. 6 is a preferred embodiment. In this embodiment, two binary weighted resistive DACs are linked by a $2^{N-1}R$ resistor to create a $(N+M+2)$−bit DAC which maximizes the input impedance from Vrt' and Vrb', provides which maximizes the input impedance from minimizes silicon area in an integrated circuit.

Figure 7:
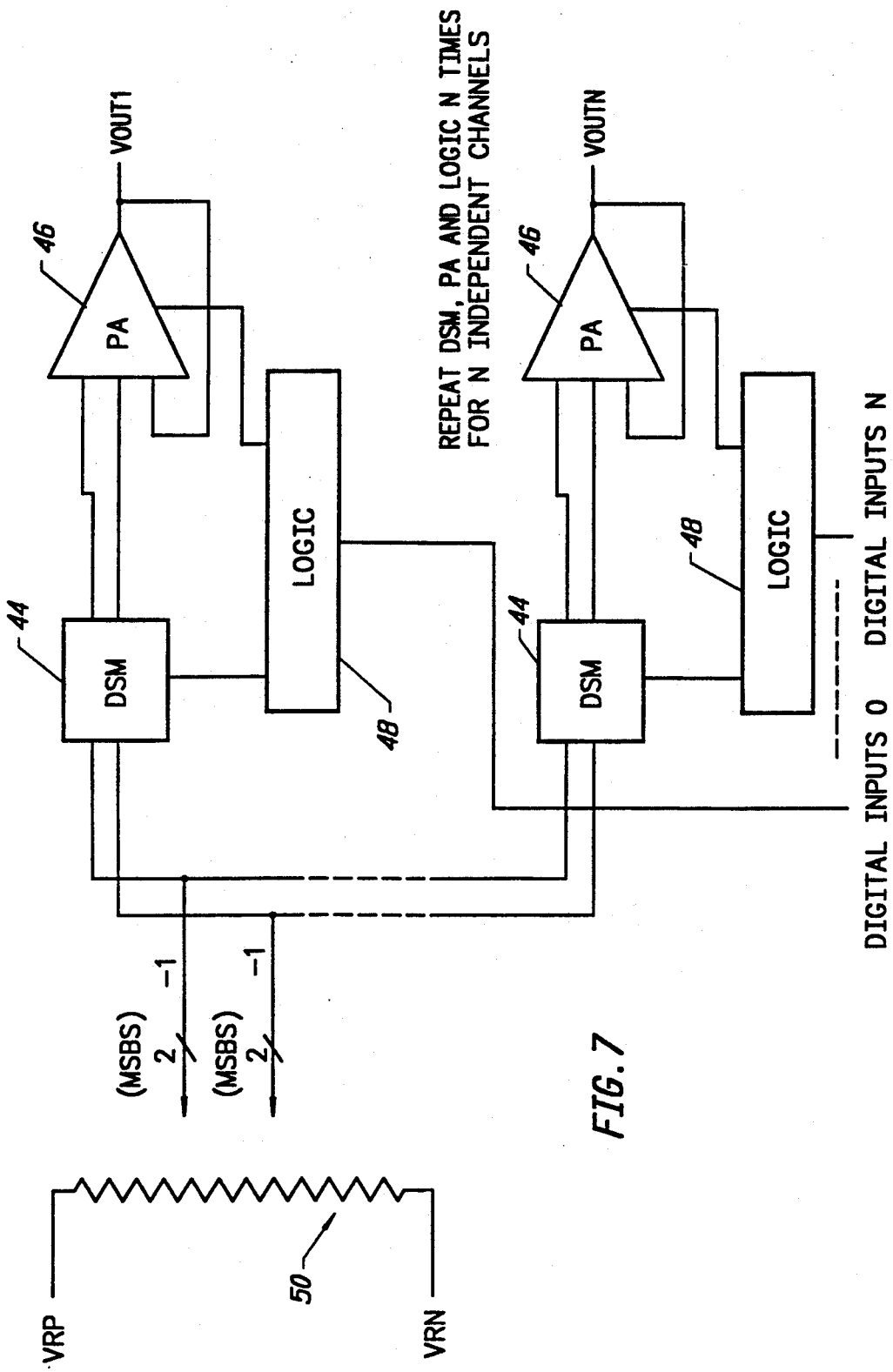
FIG. 7 is a schematic illustrating matched multichannel DACs in accordance with another embodiment of the invention.

FIG. 7 is a schematic of another embodiment of the invention in which multiple DACs share one MSB network and use independent (LSB) programmable attenuator amplifiers. Each channel ($v_{ot}$-$V_{on}$) has its own differential switch matrix 44 and programmable attenuator amplifier 46 which are driven by individual channel logic 48. The implementation of multiple channels is identical to the single channel except all of the channels share one common, precision MSB resistor ladder network 50. Each channel has an MSB differential switch matrix in order to independently tap into the MSB resistor network. Because of the transistor follower buffers in the programmable attenuator amplifier, multiple channels can share the same MSB network with very little loading or cross talk effects. The multichannel DACs provide well matched channels since all DACs rely on the same MSB network to set the MSB levels.

There has been described a digital to analog converter (DAC) incorporating a novel subranging voltage output DAC which delivers high multiplying bandwidth while consuming low power and requiring small silicon area. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A digital to analog converter (DAC) for converting a digital number having M most significant bits (MSB) and N least significant bits (LSB) to an analog value comprising a first volume divider including a first plurality of resistors connected between a first reference voltage (Vrp) and a second reference voltage (Vrn), first switch means responsive to said most significant bits for selecting two voltages, Vrt and Vrb, from said first voltage divider, a second voltage divider including a second plurality of resistors comprising at least one binary weighted resistive digital to analog converter, first connector means including at least two transistor followers coupling said two voltages, Vrt and Vrb, across said second voltage divider, and second switch means responsive to said least significant bits for selecting an output voltage from said second divider wherein a first of said transistor followers receives Vrb as a control voltage, a second of said transistor followers receives Vrt as a control voltage, said first and said second of said transistor followers being connected to a first voltage potential (+V) and through first and second current sources, respectively, to a second voltage potential (ground), and an output transistor follower is connected through a third current source to said second voltage potential (ground) and through a fourth current source to said first voltage potential (+V), and means connecting said second voltage divider to said output transistor follower.

2. A digital to analog converter (DAC) for converging a digital number having M most significant bits (MSBN) and N least significant bits (LSB) to an analog value comprisimg a first voltage divider including a first plurality of resistors connected between a first reference voltage (Vrp) and a second reference voltage (Vrn), first switch means responsive to said most significant bits for selecting two voltages, Vrt and Vrb, from said first voltage divider, a second voltagte divider including a second plurality of resistors comprising at least one binary weighted resistive digital to analog converter, first connector means including at least two transistor followers coupling said two voltages, Vrt and Vrb, across said second voltage divider, and second switch means responsive to said least significant bits for selecting an output voltage from said second divider wherein a first of said transistor followers receives Vrb as a control voltage, a second of said transistor followers receives Vrt as a control voltage, said DAC further including a current mirror connected to receive current through said first of said transistor followers, and an output device connected to receive current from said current mirror and said output voltage from said second voltage divider.

3. The DAC as defined by claim 2 wherein said output device comprises a diode.

4. The DAC as defined by claim 2 wherein said output device comprises a bipolar transistor having an emitter, a base, and a collector, said emitter connected to receive said output voltage, said collector connected to said current mirror, said DAC further including an amplifier buffer output having an input connected to said current mirror and to said collector of said bipolar transistor, an output for receiving an amplified output signal, and feedback means connecting said output to said base of said bipolar transistor.

5. The DAC as defined by claim 4 wherein said feedback means includes one resistor of a third voltage divider circuit for adjusting the gain of said amplifier buffer output relative to the difference between said first reference voltage (Vrp) and said second reference voltage (Vrn) and a third voltage (Vc).

6. A digital to analog converter (DAC) for converting a digital number having M most significant bits (MSB) and N least significant bits (LSB) to an analog value comprising a fist voltage divider including a first plurality of resistors connected between a first referred voltage (Vrp) and a second reference voltage (Vrn), first switch means responsive to said most significant bits for selecting two voltages, Vrt and Vrb, from said first voltage divider, a second voltage divider including a second plurality of resistors comprising at least one binary weighted resistive digital to analog converter, first connector means including at least two transistor followers coupling said two voltages, Vrt and Vrb, across said second voltage divider, and second switch means responsive to said least significant bits for selecting an output voltage from said second divider wherein a first of said device followers receives Vrt as a control voltage, a second and a third of said device followers receive Vrb as a control voltage, said DAC further including a current mirror connected to receive current through said third device follower, and an output device connected to receive current from said current mirror and said output voltage from said second voltage divider.

7. The DAC as defined by claim 6 wherein said output device comprises a diode.

8. The DAC as defined by claim 6 wherein said output device comprises a bipolar transistor having an emitter, a base, and a collector, said emitter connected to receive said output voltage, said collector connected to said current mirror, said DAC further including an amplifier buffer output having an input connected to said current mirror and to said collector of said bipolar transistor,, an output for receiving an amplified output signal, and feedback means connecting said output to said base of said bipolar transistor.

9. The DAC as defined by claim 8 wherein said feedback means includes one resistor of a third voltage divider for adjusting the gain of said amplifier buffer output relative to the difference between said first reference voltage (Vrp) and said second reference voltage (Vrn) and a third voltage (Vc).

10. The DAC as defined by claim 9 wherein said third voltage divider is programmable.

11. The DAC as defined by claim 8 wherein said first voltage divider comprises a thermometer resistor divider network, and said second voltage divider comprises two binary weighted resistive DACs linked by a resistor to create a (N+M+2) bit DAC.

12. A digital to analog converter (DAC) for converting a digital number having M most significant bits (MSB) and N least significant bits (LSB) to an analog value comprising
a first voltage divider including a first plurality of resistors connected between a first reference voltage (Vrp) and a second reference voltage (Vrn),
first switch means responsive to said most significant bits for selecting two voltages, Vrt and Vrb, from said first voltage divider,
a plurality of second voltage dividers each including a plurality of resistors,
first connector means including at least two transistor followers coupling said two voltages, Vrt and Vrb, across said second voltage divider, and
a plurality of second switch means responsive to said least significant bits for selecting an output voltage from each of said second dividers, and
second connector means for each of said second voltage dividers whereby said plurality of second voltage dividers share said first voltage divider and provide independent outputs.

13. The DAC as defined by claim 12, wherein a first of said transistor followers receives Vrb as a control voltage, a second of said transistor followers receives Vrt as a control voltage, and an output device is connected to receive said output voltage from said second voltage divider.

14. The DAC as defined by claim 12 wherein a first of said transistor followers receives Vrb as a control voltage, a second of said transistor followers receives vrt as a control voltage, and an output device is connected to receive output voltage from said second voltage divider.

15. The DAC as defined by claim 14 wherein said output device comprises a diode.

16. The DAC as defined by claim 14 wherein said output device comprises a bipolar transistor having an emitter, a base, and a collector, said emitter is connected to receive said output voltage, said collector is connected to said current mirror, said DAC further including an amplifier buffer output having an input connected to said current mirror and to said collector of said bipolar transistor, an output for receiving an amplified output signal, and feedback means connecting said output to said base of said bipolar transistor.

17. The DAC as defined by claim 16 wherein said feedback means includes one resistor of a third voltage divider circuit for adjusting the gain of said amplifier buffer output relative to the difference between said first reference voltage (Vrp) and said second reference voltage (Vrn) and a third voltage (Vi).

18. A digital to analog converter (DAC) for converting a digital number having M most significant bits (MSB) and N least significant bits (LSB) to an analog value comprising
a first voltage divider comprising a thermometer resistor divider network connected between a first reference voltage (Vrp) and a second reference voltage (Vrn),
first switch means responsive to said most significant bits for selecting two voltages, Vrt and Vrb, from said first voltage divider,
a second voltage divider comprising two binary weighted resistive DACs linked by a resistor to create a (n+M+2) −bit DAC,
first connector means including at least two transistor followers coupling said two voltages, Vrt and Vrb, across said second voltage divider, and
second switch means responsive to said least significant bits for selecting an output voltage from said second divider.

* * * * *